United States Patent
Protopopov et al.

(10) Patent No.: US 12,087,550 B2
(45) Date of Patent: Sep. 10, 2024

(54) DEVICE FOR MEASURING DENSITY OF PLASMA, PLASMA PROCESSING SYSTEM, AND SEMICONDUCTOR DEVICE MANUFACTURING METHOD USING THE SAME

(71) Applicant: SAMSUNG ELECTRONICS CO., LTD., Suwon-si (KR)

(72) Inventors: Vladimir Vsevolodovich Protopopov, Suwon-si (KR); Vasily Grigorievich Pashkovskiy, Suwon-si (KR); Chansoo Kang, Hwaseong-si (KR); Youngdo Kim, Hwaseong-si (KR); Hoonseop Kim, Suwon-si (KR); Sangki Nam, Seongnam-si (KR); Sejin Oh, Hwaseong-si (KR); Changsoon Lim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 138 days.

(21) Appl. No.: 17/874,475

(22) Filed: Jul. 27, 2022

(65) Prior Publication Data
US 2023/0102201 A1    Mar. 30, 2023

(30) Foreign Application Priority Data
Sep. 29, 2021    (KR) .......................... 10-2021-0128947

(51) Int. Cl.
*H01J 37/32* (2006.01)

(52) U.S. Cl.
CPC .. *H01J 37/32201* (2013.01); *H01J 37/32935* (2013.01)

(58) Field of Classification Search
CPC .......... H01J 37/32201; H01J 37/32935; H05H 1/0025
See application file for complete search history.

(56) References Cited

U.S. PATENT DOCUMENTS

| | | | | |
|---|---|---|---|---|
| 7,064,812 | B2* | 6/2006 | Ludviksson | ...... H01J 37/32935 250/282 |
| 8,545,669 | B2* | 10/2013 | Mahoney | .......... H01J 37/32954 156/345.24 |
| 9,601,397 | B1 | 3/2017 | Oh et al. | |
| 10,229,818 | B2 | 3/2019 | Vladimir et al. | |
| 2009/0230973 | A1 | 9/2009 | Sugai et al. | |
| 2011/0039355 | A1* | 2/2011 | Zhao | ................... H01J 37/3244 257/E21.528 |

(Continued)

FOREIGN PATENT DOCUMENTS

| | | | |
|---|---|---|---|
| JP | H06-243991 A | | 9/1994 |
| JP | 2011097446 A | * | 5/2011 |

(Continued)

*Primary Examiner* — Abdullah A Riyami
*Assistant Examiner* — Syed M Kaiser
(74) *Attorney, Agent, or Firm* — Muir Patent Law, PLLC

(57) ABSTRACT

A device for measuring a density of plasma is provided. The device includes a first sensor configured to measure a microwave spectrum of an input port reflection parameter of plasma, the first sensor having a probe including a conductive material and a flat plate shape, and a second sensor configured to measure an optical signal generated from the plasma, the second sensor being configured to detect the optical signal through the probe of the first sensor.

19 Claims, 7 Drawing Sheets

(56) References Cited

U.S. PATENT DOCUMENTS

2015/0124250 A1    5/2015  Bao et al.
2017/0341183 A1*  11/2017  Buller ..................... B22F 10/36
2017/0355147 A1*  12/2017  Buller ..................... B23K 26/36

FOREIGN PATENT DOCUMENTS

| | | |
|---|---|---|
| KR | 10-1999-0057488 A | 7/1999 |
| KR | 10-2009-0132421 A | 12/2009 |
| KR | 10-2016-0079050 A | 7/2016 |
| KR | 10-2017-0106817 A | 9/2017 |
| KR | 10-2024468 B1 | 9/2019 |
| KR | 10-2200662 B1 | 1/2021 |
| WO | WO-2016177953 A1 * 11/2016 ........... C23C 16/045 |

\* cited by examiner

DEVICE FOR MEASURING DENSITY OF PLASMA, PLASMA PROCESSING SYSTEM, AND SEMICONDUCTOR DEVICE MANUFACTURING METHOD USING THE SAME

CROSS-REFERENCE TO RELATED APPLICATION

This application is based on and claims priority under 35 U.S.C. § 119 to Korean Patent Application No. 10-2021-0128947, filed on Sep. 29, 2021, in the Korean Intellectual Property Office, the disclosure of which is incorporated by reference herein in its entirety.

BACKGROUND

1. Field

Embodiments relate to a device for measuring the density of plasma, a plasma processing system, and a semiconductor device manufacturing method employing the plasma processing system.

2. Description of the Related Art

Examples of processes of manufacturing a semiconductor device include plasma processes, e.g., plasma-enhanced deposition, plasma etching, plasma cleaning, etc. Due to miniaturization and high level of integration of semiconductor devices in recent years, fine errors in plasma processes have had a larger effect on the quality of semiconductor products. Accordingly, various methods of precisely measuring parameters representing a state of plasma in plasma equipment are being studied.

SUMMARY

According to an aspect of example embodiments, a device for measuring the density of plasma is provided. The device includes: a first sensor configured to measure a microwave spectrum of an input port reflection parameter of plasma; and a second sensor configured to measure an optical signal generated from the plasma, wherein the first sensor includes a probe having a flat plate shape and including a conductive material, and the second sensor measures the optical signal from the plasma through the probe of the first sensor.

According to another aspect of example embodiments, a plasma processing system is provided. The plasma processing system includes: a plasma processing apparatus configured to generate plasma; a plasma density measuring device including a first sensor configured to measure a microwave spectrum of an input port reflection parameter of the plasma and a second sensor including an optical sensor configured to measure an optical signal generated from the plasma; a network analyzer electrically connected to the first sensor and configured to transmit a signal in a microwave band to the first sensor and read the microwave spectrum of the input port reflection parameter measured by the first sensor; and a processor configured to calculate an absolute value of a density of a part of the plasma based on the microwave spectrum of the input port reflection parameter and calculate a radial profile of a relative value of a density of the plasma based on the optical signal measured by the second sensor, wherein the first sensor includes a probe having a flat plate shape, and the second sensor measures the optical signal from the plasma through the probe of the first sensor.

According to yet another aspect of example embodiments, a method of manufacturing a semiconductor device is provided. The method includes: treating a wafer with plasma within a plasma chamber; and measuring a profile of an absolute value of a density of the plasma along a radius of the plasma, wherein the measuring of the profile of the absolute value of the density of the plasma along the radius thereof includes: measuring a microwave spectrum of an input port reflection parameter of the plasma by using a first sensor including a probe having a flat plate shape and including a pinhole; and measuring an optical signal generated from the plasma through the pinhole by using a second sensor including an optical sensor.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
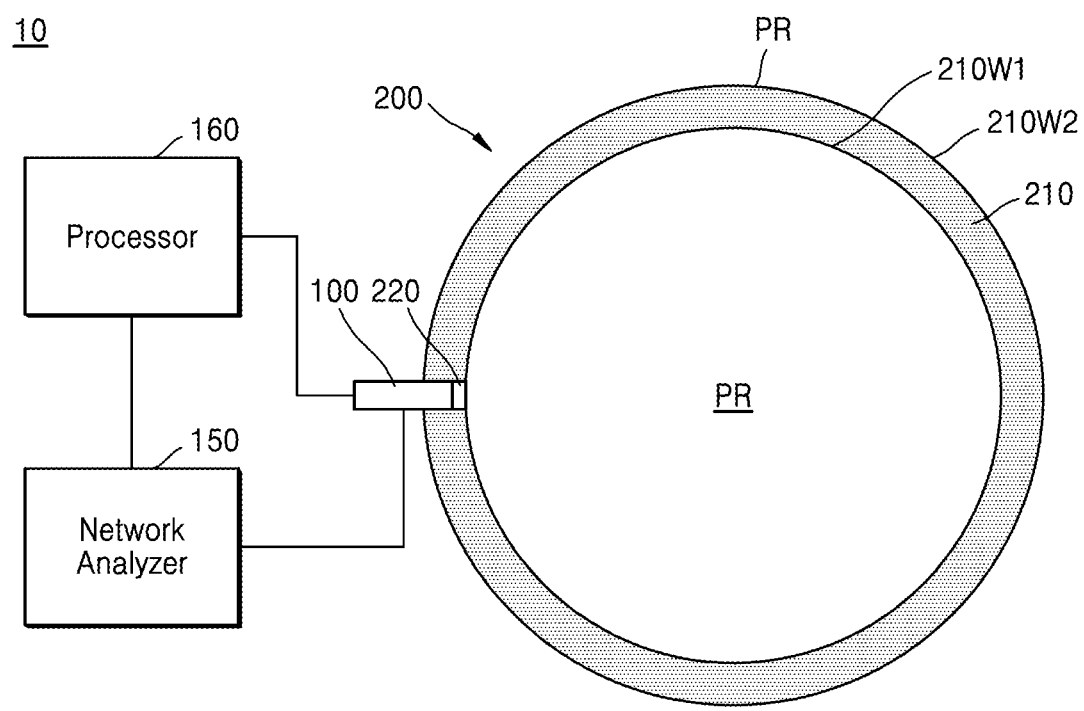
FIG. 1 is a diagram for explaining a plasma processing system according to example embodiments.
Figure 2:
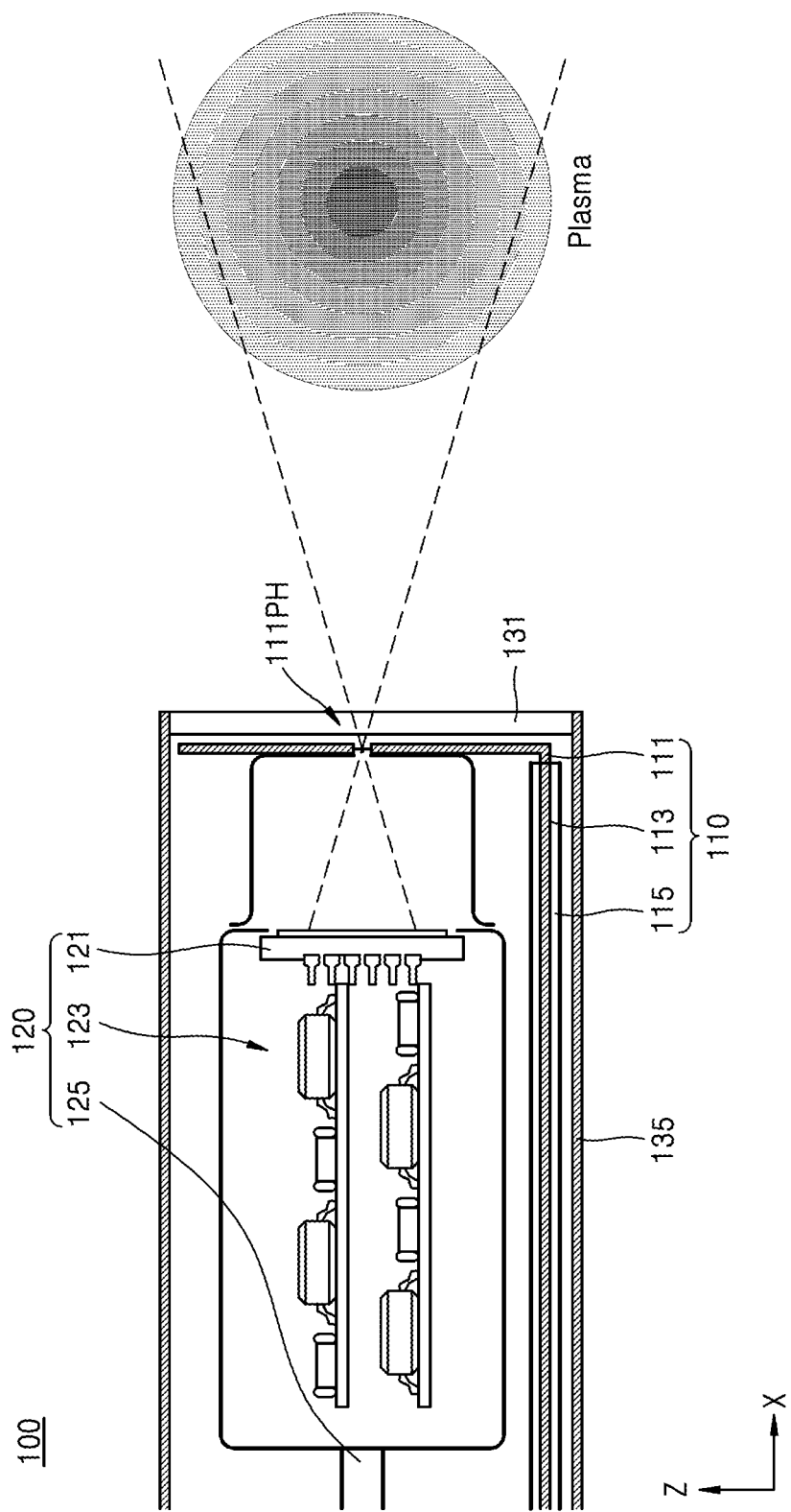
FIG. 2 is a diagram for explaining a plasma density measuring device included in a plasma processing apparatus, according to example embodiments.
Figure 3:
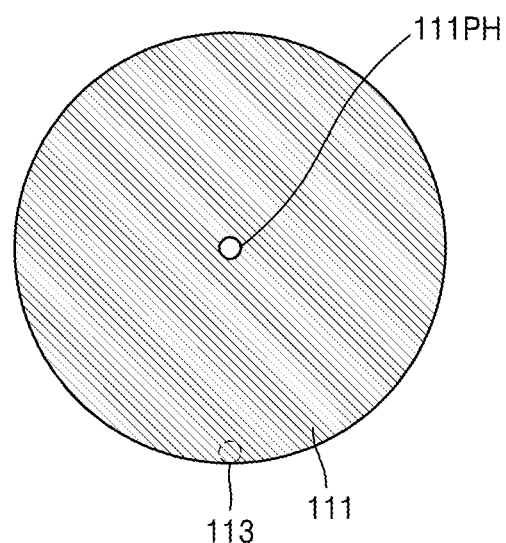
FIG. 3 shows a probe of a first sensor included in a plasma density measuring device, according to example embodiments.

FIG. 1 is a diagram for explaining a plasma processing system 10 according to example embodiments. FIG. 2 is a diagram for explaining a plasma density measuring device 100 included in the plasma processing system 10, according to example embodiments. FIG. 3 shows a probe 111 of a first sensor 110 included in the plasma density measuring device 100, according to example embodiments.

Referring to FIGS. 1 through 3, the plasma processing system 10 may include the plasma density measuring device 100, a network analyzer 150, a processor 160, and a plasma processing apparatus 200.

The plasma processing apparatus 200 may be configured to generate plasma in a plasma region PR. For example, the plasma processing apparatus 200 may include a capacitive coupled plasma source, an inductively coupled plasma source, a microwave plasma source, a remote plasma source, etc.

The plasma processing apparatus 200 may include a chamber 210 for isolating the plasma region PR from outside. The chamber 210 may include an inner wall 210W1 facing the plasma region PR and an outer wall 210W2 opposite the inner wall 210W1.

According to example embodiments, the plasma processing apparatus 200 may include a view port 220. The view port 220 may be located on the inner wall 210W1 of the chamber 210. The view port 220 may be a window for the plasma region PR. As a non-limiting example, the chamber 210 may include a hole having a cylindrical shape and extending from the inner wall 210W1 to the outer wall 210W2.

The view port 220 may be configured to be coupled to the plasma density measuring device 100. The view port 220 may include, e.g., quartz or sapphire. A length of the hole of the chamber 210 corresponding to the view port 220 may be determined according to a surface wave resonance theory.

The plasma processing apparatus 200 may be an apparatus for treating a wafer with generated plasma. The plasma processing apparatus 200 may perform one of, e.g., plasma annealing, plasma etching, plasma-enhanced chemical vapor deposition (PECVD), sputtering, and plasma cleaning on the wafer.

For example, the plasma processing apparatus 200 may perform a reactive ion etching (RIE) process on a wafer. RIE is a dry etching process whereby species (radicals, ions) excited by a high frequency radio frequency (RF) power source etch a substrate or thin films in a low-pressure chamber. RIE may be performed due to complexity of physical reactions due to energetic ion bombardment and chemical reactions of chemically active species. For example, RIE may include etching of an insulating layer, e.g., silicon oxide, etching of a metal material, and etching of a doped or undoped semiconductor material.

As another example, the plasma processing apparatus 200 may perform an isotropic etching process on a wafer. The plasma processing apparatus 200 may perform a process of substituting silicon oxide formed on the wafer with ammonium hexafluorosilicate $((NH_4)_2SiF_6)$ and removing the $(NH_4)_2SiF_6$ through annealing.

As yet another example, the plasma processing apparatus 200 may perform a process of isotopically removing one of crystalline and/or amorphous silicon, silicon nitride, and a metal on a wafer by alternately repeating plasma treatment and annealing thereon.

The wafer may include, e.g., silicon (Si). The wafer may include germanium (Ge) or compound semiconductors, e.g., silicon carbide (SiC), gallium arsenide (GaAs), indium arsenide (InAs), and indium phosphide (InP). According to some embodiments, the wafer may have a silicon on insulator (SOI) structure. The wafer may include a buried oxide layer. According to some embodiments, the wafer may include conductive regions, e.g., wells doped with impurities. According to some embodiments, the wafer may have various device isolation structures, e.g., shallow trench isolation (STI), for isolating the doped wells from each other.

The plasma density measuring device 100 may include the first sensor 110, a second sensor 120, a window 131, and a return path 135. According to example embodiments, the plasma density measuring device 100 may be a non-invasive measuring instrument, e.g., the plasma density measuring device 100 may be external with respect to the plasma processing apparatus 200. According to example embodiments, the plasma density measuring device 100 may measure the density of plasma in the plasma region PR through the view port 220 while being outside the plasma processing apparatus 200. According to example embodiments, the plasma density measuring device 100 may determine a plasma density profile, i.e., a change in plasma density along a radius from the center of the plasma region PR (e.g., the center of the chamber 210) toward an inner wall 210W1 of the chamber 210.

The window 131 and the return path 135 may isolate the first and second sensors 110 and 120 from an external environment, e.g., the window 131 and the return path 135 may contact each other to define a volumetric container completely enclosing the first and second sensors 110 and 120 therein. For example, referring to FIGS. 1 and 2, the window 131 may be positioned to face an interior of the chamber 210 through the view port 220, and the return path 135 may extend from the window 131 through the hole extending from the inner wall 210W1 to the outer wall 210W2 of the chamber 210. The window 131 may be transparent to a microwave signal measured by the first sensor 110 and an optical signal measured by the second sensor 120. Ground potential may be applied to the return path 135, and accordingly, an effect of external noise on measurements by the first and second sensors 110 and 120 may be mitigated.

According to example embodiments, the first sensor 110 may measure the density of plasma by using microwaves, e.g., the first sensor 110 may be a microwave absorption probe (MAP). According to example embodiments, the first sensor 110 may be configured to determine an absolute value of a density of a specific part of the plasma region PR (e.g., an edge portion of the plasma region PR).

According to example embodiments, the first sensor 110 may transmit a microwave to the plasma and measure an intensity of a reflected microwave and/or signal. According to example embodiments, the first sensor 110 may transmit chopped, e.g., varying or non-constant, microwaves having different frequencies in a microwave band to the plasma. According to example embodiments, the first sensor 110 may provide a chirped signal in the microwave band to the plasma.

According to example embodiments, the first sensor 110 may measure a microwave spectrum of a parameter of the plasma. In detail, the first sensor 110 may be configured to measure an input port reflection parameter S11 of the plasma. The input port reflection parameter S11 of the plasma may be defined as a ratio of the magnitude of the signal transmitted to the plasma, reflected by the plasma, and then measured again by the first sensor 110 to the signal transmitted by the first sensor 110. A microwave spectrum of the input port reflection parameter S11 of the plasma may be measured by scanning a frequency of the signal transmitted to the plasma by the first sensor 110 in the microwave band.

According to example embodiments, the first sensor 110 may include a probe 111, a signal line 113, and an insulating layer 115.

According to example embodiments, the probe 111 may have a flat plate shape, e.g., the probe may have a constant thickness in the X direction. According to example embodiments, the probe 111 may have, e.g., a disk shape. According to example embodiments, the probe 111 may have a circular shape in a plan view, e.g., the probe 111 may face the window 131 and have a circular cross-section in a plan view (when faced from the window 131). According to example embodiments, the probe 111 may include a conductive material. According to example embodiments, the probe 111 may include a metal material, e.g., copper (Cu), aluminum (Al), etc.

According to example embodiments, the probe 111 may include a pinhole 111PH, e.g., the pinhole 111PH may extend through an entire thickness of the probe 111. As a non-limiting example, the pinhole 111PH may be formed at a center of the probe 111, e.g., at a center of the circular-cross-section. As a non-limiting example, the pinhole 111PH may have a circular shape, e.g., a circular cross-section in a plan view (when faced from the window 131).

According to example embodiments, the signal line 113 may be connected to the probe 111, e.g., the signal line 113 may extend in the X direction to directly connect to the probe 111. According to example embodiments, the probe 111 may be spaced apart from a center of the signal line 113. According to example embodiments, the signal line 113 may be connected to an edge of the probe 111. According to example embodiments, the signal line 113 may be spaced apart from the pinhole 111PH in a direction parallel to an upper surface of the probe 111.

According to example embodiments, the signal line 113 may transmit, to the probe 111, power for applying microwaves to the plasma, or transmit microwaves reflected by the plasma sensed by the probe 111 to the outside (e.g., the network analyzer 150). The signal line 113 may include a conductive material. According to example embodiments, the signal line 113 may include a metal material, e.g., Cu, Al, etc. Furthermore, unlike in FIG. 2, the signal line 113 and the probe 111 may be continuously integrated into a single body, in which case a separate boundary is not formed between the signal line 113 and the probe 111.

The insulating layer 115 may cover the signal line 113. According to example embodiments, the insulating layer 115 may include an insulating material, e.g., a ceramic material or the like. The insulating layer 115 may protect the signal line 113 and insulate the signal line 113 from the outside.

According to example embodiments, the signal line 113 and the insulating layer 115 may construct, e.g., an RF cable. As non-limiting examples, the RF cable constructed of the signal line 113 and the insulating layer 115 may include one of RG 58, RG 316, RG 400, RG 402, RG 405, SF/SR 085, SF/SR 141, and LMR 200. According to example embodiments, the probe 111 may be connected to the network analyzer 150 via the signal line 113.

According to other example embodiments, a microwave connector may be connected to the signal line 113. Examples of the microwave connector may include SubMiniature A (SMA), SubMiniature B (SMB), N Type, Bayonet Neil-Concelman (BNC), TNC, and 7/16 DIN. In this case, the first sensor 110 may be connected to the network analyzer 150 via the microwave connector.

A microwave spectrum of the input port reflection parameter S11 of the plasma, which is measured by the first sensor 110, may be analyzed by the network analyzer 150 to thereby determine an absolute value of density of the plasma.

For example, when turbulence, e.g., a microwave generated by the probe 111, occurs in the plasma, propagation of the turbulence in the plasma is determined according to Maxwell's equations. In this case, according to a dispersion relation of the plasma, when a frequency of a microwave that is turbulence generated in the plasma is lower than a frequency determined by plasma properties (e.g., electron density), a wave number of the microwave is an imaginary number. Because the microwave having an imaginary wave number is a damped wave, the microwave may perish, e.g., diminish, during propagation in the plasma. On the other hand, when a frequency of a microwave that is turbulence generated in the plasma is higher than a characteristic frequency of the plasma, the microwave has a real wave number, and thus, may be reflected by the plasma and received by the probe 111.

Accordingly, when a spectrum of the input port reflection parameter S11 of the plasma is measured, an electron density in the plasma may be calculated based on a characteristic frequency, e.g., a cut-off frequency of the spectrum of the input port reflection parameter S11. A relationship between a characteristic frequency $f_c$ of a spectrum and an electron density no in plasma is defined by using the following Equation 1:

$$n_0 = \frac{\epsilon_0 m}{e^2}\omega_c^2 = \frac{\epsilon_0 m}{e^2}(2\pi f_c)^2 = 1.24 * (f_c)^2 * 10^{10} \text{ cm}^{-3} \quad \text{[Equation 1]}$$

In Equation 1, m is a mass of an electron, Co is a dielectric constant of vacuum, e is a fundamental charge, and $\omega_c$ is a characteristic angular frequency (=$2\pi * f_c$).

The second sensor 120 may measure plasma through the pinhole 111PH of the probe 111. The second sensor 120 may measure an optical signal generated from the plasma.

In detail, according to example embodiments, the first sensor 110 may be configured to determine a relative value of plasma density along a radius of the plasma region PR. Because the probe 111 includes a conductive material, e.g., a metal material as described above, a portion of the probe 111, where the pinhole 111PH is not formed, may block an optical signal generated from the plasma. Thus, the second sensor 120 may measure the optical signal from the plasma only through the pinhole 111PH of the probe 111.

According to example embodiments, the second sensor 120 may include an optical sensor 121, an electronic component 123 including a passive element and an active element, and a connector 125. For example, referring to FIG. 2, the optical sensor 121 may overlap the probe 111 along the X direction, e.g., the probe 111 may be between the optical sensor 121 and the window 131, and the electronic component 123 may be between the optical sensor 121 and the connector 125. For example, as illustrated in FIG. 2, the optical sensor 121 may completely overlap, e.g., and extend beyond, the pinhole 111PH in the probe 111. For example, as illustrated in FIG. 2, the optical sensor 121 may be spaced apart from the signal line 113 of the first sensor 110 along the Z direction (i.e., the radial direction of the probe 111), e.g., the optical sensor 121 and the signal line 113 may overlap different portions of the probe 111 in the X direction. According to example embodiments, the optical sensor 121 may include a charge-coupled device (CCD) sensor or a complementary metal-oxide-semiconductor (CMOS) image sensor. The optical sensor 121 may include, e.g., a linear array camera, a CMOS camera, etc. The connector 125 may be, e.g., a universal serial bus (USB) cable.

According to example embodiments, the second sensor 120 may measure plasma in a region adjacent to a surface of a workpiece (e.g., a semiconductor substrate). According to other example embodiments, the second sensor 120 may be spaced apart from a workpiece (e.g., a semiconductor substrate) by a certain distance. In this case, a result of plasma measurement by the second sensor 120 may be converted into a plasma state in the region adjacent to the surface of the workpiece (e.g., a semiconductor substrate). The conversion may be performed using simulation, or based on a predetermined lookup table.

According to example embodiments, a profile of a relative value of plasma density along the radius in the plasma region PR may be calculated by performing Abel transformation on a measurement result obtained from the second sensor 120, e.g., the second sensor 120 may be an Abel sensor. Here, a relative value of plasma density may be a dimensionless quantity representing a standardized relative value of a density of parts of the plasma region PR based on a density of a specific part (e.g., the center) of the plasma region PR.

The Abel transformation may be a mathematical operation that transforms an optical signal sensed by the second sensor 120 into a signal generated from plasma located on an opposite side of the optical sensor 121. According to example embodiments, a radial profile of a relative value of plasma density may be calculated by performing Abel transformation.

According to example embodiments, an absolute value of a density of a region of plasma may be obtained by using the first sensor 110, and a radial profile of a relative value of a density of the plasma may be obtained by using the second sensor 120. According to example embodiments, the plasma density measuring device 100 may obtain a radial profile of an absolute value of a density of the plasma based on measurement results obtained from the first and second sensors 110 and 120. According to example embodiments, the plasma density measuring device 100 may obtain a profile of an absolute value of plasma density by combining the measurement results from the first and second sensors 110 and 120. Because the first sensor 110 uses a signal in a microwave band, and the second sensor 120 uses an optical signal, there is no substantial signal interference between the signals respectively used for measurements by the first and second sensors 110 and 120, and thus, the plasma density measuring device 100 having a high reliability may be provided.

The network analyzer 150 may operate both as a frequency scanner and a spectrometer. In detail, the network analyzer 150 may provide an electrical signal (e.g., a signal for oscillating the probe 111) for measuring parameters of the plasma using a frequency scanning method. In addition, the network analyzer 150 may calculate a microwave spectrum of the input port reflection parameter S11, based on a signal detected by the probe 111.

The network analyzer 150 may be electrically connected to the probe 111 of the first sensor 110. A voltage of a sinusoidal waveform applied to the probe 111 by the network analyzer 150 may be converted into a microwave and emitted to the plasma. As a non-limiting example, the network analyzer 150 may provide chopped electrical signals to the probe 111 so that the probe 111 may generate chopped microwaves having frequencies corresponding to different wavelengths in the microwave band. As a non-limiting example, the network analyzer 150 may provide a chirped electrical signal to the probe 111.

A microwave signal emitted by the probe 111 and reflected by the plasma may be converted into an electrical signal by the probe 111 and transmitted to the network analyzer 150. The network analyzer 150 may store data regarding the electrical signal.

The processor 160 may calculate a density of the plasma based on the data stored in the network analyzer 150. The processor 160 may calculate an absolute value of the plasma density of a part of the plasma region PR. The processor 160 may calculate a profile of a relative value of the density along a radius of the plasma region PR by performing Abel transformation on data measured by the second sensor 120. The processor 160 may calculate a profile of an absolute value of the density along the radius of the plasma region PR, based on the profile of the relative value of the density along the radius of the plasma region PR and the absolute value of the part of the plasma region PR.

The network analyzer 150 and the processor 160 each may be a computing device, e.g., a workstation computer, a desktop computer, a laptop computer, a tablet computer, or the like. The network analyzer 150 and the processor 160 may be each composed of separate hardware, or they may be separate software components included in a piece of hardware. The network analyzer 150 and the processor 160 may be each implemented as a simple controller, a complex processor, e.g., a microprocessor, a central processing unit (CPU), a graphics processing unit (GPU) etc., or a processor composed of software, dedicated hardware or firmware, or the like. The network analyzer 150 and the processor 160 may be implemented using, e.g., a general-purpose computer or application specific hardware such as an application-specific integrated circuit (ASIC), a field programmable gate array (FPGA), digital signal processor (DSP), etc.

According to some embodiments, operations of the network analyzer 150 and the processor 160 may be implemented as commands stored on a machine-readable medium that is readable and executable by one or more processors. Here, the machine-readable medium may include any mechanism for storing and/or transmitting information in a form that is readable by a machine (e.g., a computing device). For example, the machine-readable medium may include read-only memory (ROM), random access memory (RAM), a magnetic disk storage medium, an optical storage medium, flash memory devices, electrical, optical, acoustic, or other forms of propagated signals (e.g., a carrier wave, an infrared signal, a digital signal, etc.), and any other signal.

The network analyzer 150 and the processor 160 may be composed of firmware, software, routines, and instructions for performing the above-described operations thereof or any process as described below. However, it should be understood that these descriptions are merely for convenience and that the operations of the network analyzer 150 and the processor 160 may result from a computing device, a processor, a controller, or other devices executing the firmware, the software, the routines, the instructions, etc.

Figure 4A:
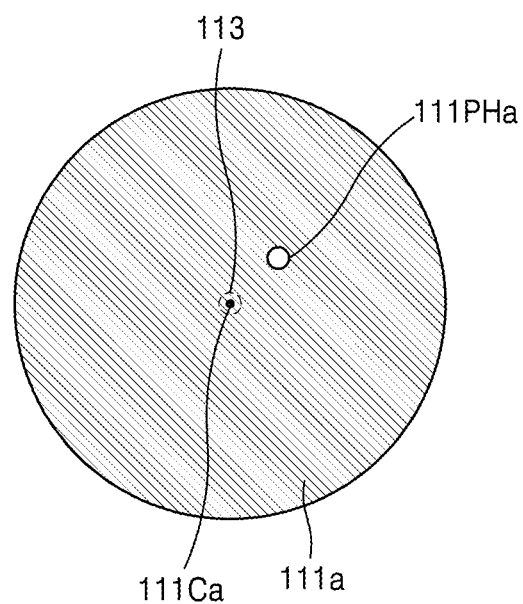
FIG. 4A is a plan view of a probe according to other example embodiments.

FIG. 4A is a plan view of a probe 111a according to other example embodiments, corresponding to the probe 111 of FIG. 3. For convenience of description, descriptions that are provided above with respect to FIGS. 1 through 3 are omitted, and only a difference therebetween is described.

Referring to FIG. 4A, a pinhole 111PHa of the probe 111a may be spaced apart from a center 111Ca thereof. According to example embodiments, the signal line 113 may be in contact with the center 111Ca of the probe 111a. According to example embodiments, the pinhole 111PHa of the probe 111a may be spaced apart from the signal line 113.

Figure 4B:
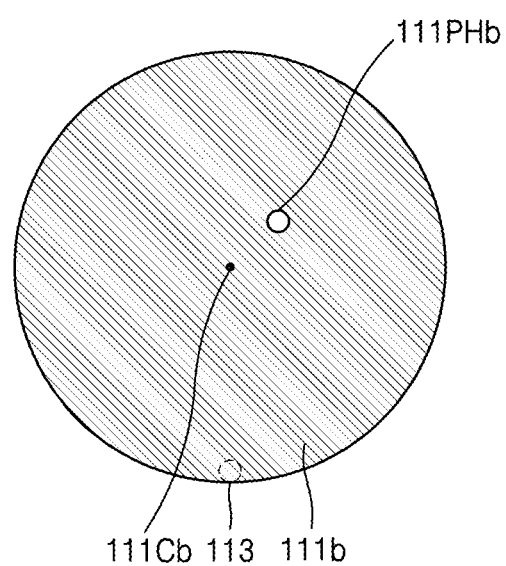
FIG. 4B is a plan view of a probe according to other example embodiments.

FIG. 4B is a plan view of a probe 111b according to other example embodiments, corresponding to the probe 111 of FIG. 3. For convenience of description, descriptions that are provided above with respect to FIGS. 1 through 3 are omitted, and only a difference therebetween is described.

Referring to FIG. 4B, a pinhole 111PHb of the probe 111b may be spaced apart from a center 111Cb thereof. According to example embodiments, the signal line 113 may be spaced apart from the center 111Cb of the probe 111b. According to example embodiments, as another example, the pinhole 111PHb of the probe 111b and the signal line 113 may be each spaced apart from the center 111Cb of the probe 111b. According to example embodiments, the pinhole 111PHb of the probe 111b may be spaced apart from the signal line 113.

Figure 5:
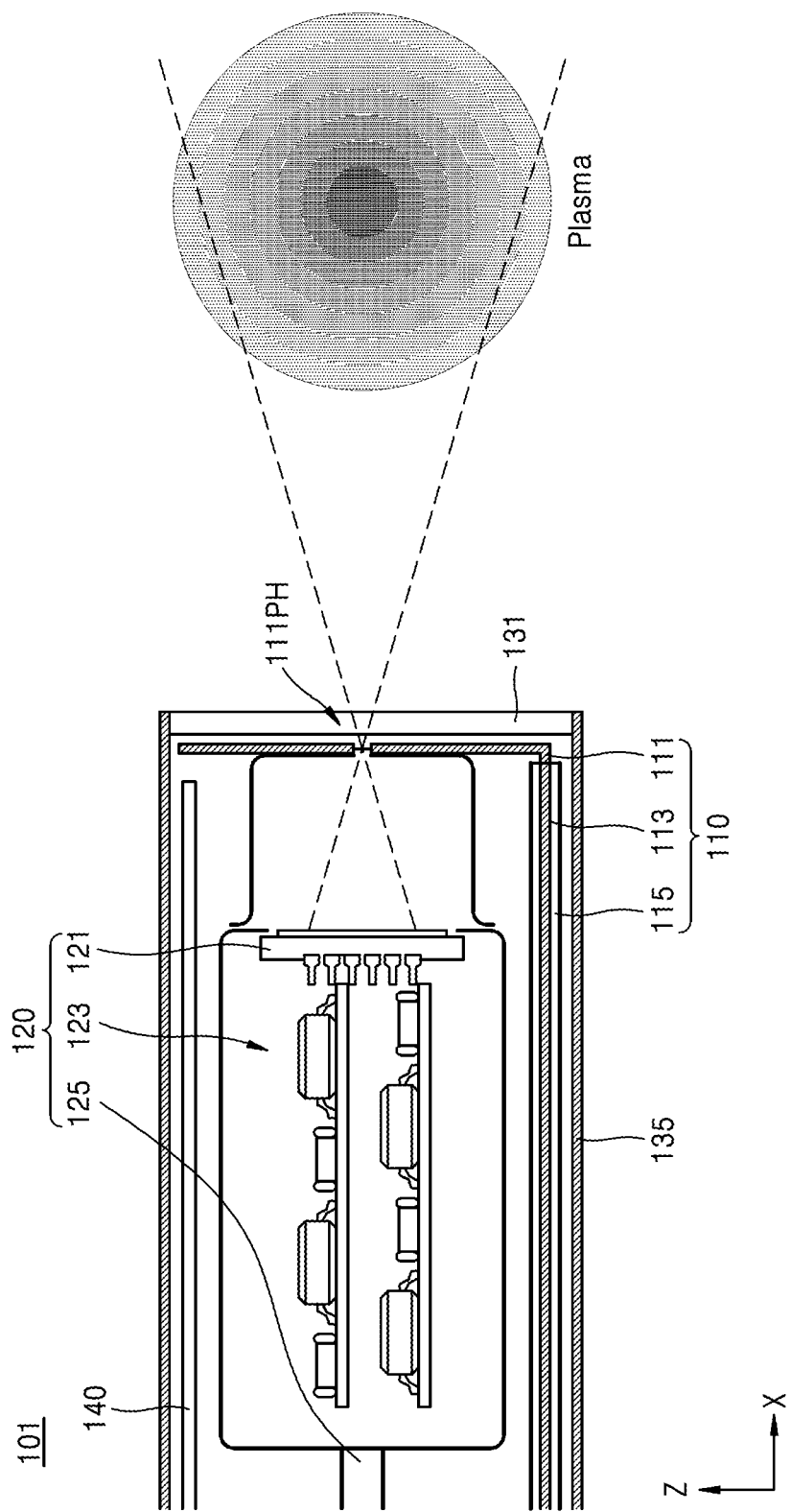
FIG. 5 is a diagram for explaining a plasma density measuring device according to other example embodiments.

FIG. 5 is a diagram for explaining a plasma density measuring device 101 according to other example embodiments.

The plasma density measuring device 101 may include the first sensor 110, the second sensor 120, and an optical cable 140. Because the first and second sensors 110 and 120 are substantially the same as their counterparts described with reference to FIG. 2 a description thereof is omitted.

According to example embodiments, the optical cable 140 may collect light generated from plasma. The optical cable 140 may transmit the collected light to an optical emission spectrometer (OES). The OES may determine, based on the light generated from the plasma, a composition and a composition ratio of positive ions contained in the plasma.

Figure 6:
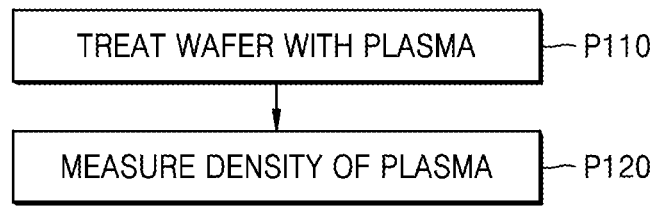
FIG. 6 is a flowchart of a method of manufacturing a semiconductor device, according to example embodiments.

FIG. 6 is a flowchart of a method of manufacturing a semiconductor device, according to example embodiments.

Referring to FIG. 6, the method of manufacturing a semiconductor device may include treating a wafer with plasma (P110) and measuring parameters of the plasma (P120). As described above, treatment of the wafer with the plasma may include, e.g., one of plasma annealing, plasma etching, PECVD, physical vapor deposition (PVD), and plasma cleaning.

For example, measurement of the parameters of the plasma (P120) may be performed simultaneously with treatment of the wafer with the plasma (P110). As another example, measurement of the parameters of the plasma in operation (P120) may be performed before or after treatment of the wafer with the plasma (P110). As yet another example, measurement of the parameters of the plasma (P120) may be periodically performed based on a preset reliability test period.

As described with reference to FIGS. 1 through 3, the measurement of the parameters of the plasma may include determining an absolute value of plasma density in a part of the plasma region PR by using the first sensor 110, determining a radial profile of a relative value of plasma density in the plasma region PR by using the second sensor 120, and determining a profile of an absolute value of plasma density in the plasma region PR by combining the absolute value of the plasma density in the part of the plasma region PR with the radial profile of the relative value of the plasma density in the plasma region PR.

By way of summation and review, methods of measuring plasma parameters may include an invasive method using a probe placed in a process chamber and a non-invasive method using a probe outside plasma. While the invasive method allows measurement of a position of a probe by changing the position thereof, and thus, direct measurement of a radial profile of an absolute value of plasma density, it is difficult to adopt this method in manufacturing an actual semiconductor device because the probe causes distortion in plasma density distributions. On the other hand, the non-invasive method allows real-time monitoring of plasma treatment during manufacturing of a semiconductor device because this method may not cause distortion in plasma density distributions.

Therefore, example embodiments provide a device and a method of measuring the density of plasma, a plasma processing apparatus, and a semiconductor device manufacturing method using the same. That is, example embodiment combine an absolute value of plasma density measured by a microwave absorption sensor with a relative value of plasma density measured by an optical sensor to monitor a spatial distribution of an absolute value of a plasma density in real-time.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A plasma processing system, comprising:
a plasma processing apparatus configured to generate plasma; and
a plasma density measuring device including:
a first sensor configured to measure a microwave spectrum of an input port reflection parameter of the plasma, the first sensor having a probe including a conductive material and a flat plate shape; and
a second sensor configured to measure an optical signal generated from the plasma, the second sensor being configured to detect the optical signal through the probe of the first sensor,
wherein the probe includes a pinhole, the second sensor being configured to measure the optical signal through the pinhole.

2. The plasma processing system as claimed in claim 1, wherein the probe has a circular shape in a plan view.

3. The plasma processing system as claimed in claim 1, wherein the pinhole has a circular shape.

4. The plasma processing system as claimed in claim 1, further comprising a signal line connected to the probe, the pinhole being spaced apart from the signal line.

5. The plasma processing system as claimed in claim 4, wherein the pinhole is at a center of the probe, and the signal line is connected to an edge of the probe.

6. The plasma processing system as claimed in claim 4, wherein the signal line is connected to a center of the probe, and the pinhole is spaced apart from the center of the probe.

7. The plasma processing system as claimed in claim 4, wherein each of the pinhole and the signal line is spaced apart from a center of the probe.

8. A plasma processing system, comprising:
a plasma processing apparatus configured to generate plasma; and
a plasma density measuring device including:
a first sensor configured to measure a microwave spectrum of an input port reflection parameter of the plasma, the first sensor including a probe having a flat plate shape, and
a second sensor including an optical sensor configured to measure an optical signal generated from the plasma, the optical sensor being configured to measures the optical signal through the probe of the first sensor;
a network analyzer electrically connected to the first sensor, the network analyzer being configured to transmit a signal in a microwave band to the first sensor and to read the microwave spectrum of the input port reflection parameter measured by the first sensor; and
a processor configured to calculate an absolute value of a density of a part of the plasma based on the microwave spectrum of the input port reflection parameter and to calculate a radial profile of a relative value of the density of the plasma based on the optical signal measured by the second sensor.

9. The plasma processing system as claimed in claim 8, wherein the processor is further configured to determine a radial profile of an absolute value of the density of the plasma, based on the absolute value of the density of the part of the plasma and the radial profile of the relative value of the density of the plasma.

10. The plasma processing system as claimed in claim 8, wherein the probe includes a pinhole, and the second sensor is configured to measure the optical signal from the plasma through the pinhole.

11. The plasma processing system as claimed in claim 10, wherein the plasma density measuring device further includes a signal line connecting the probe to the network analyzer, the pinhole being spaced apart from the signal line.

12. The plasma processing system as claimed in claim 11, wherein the pinhole is at a center of the probe, and the signal line is connected to an edge of the probe.

13. The plasma processing apparatus as claimed in claim 11, wherein the signal line is connected to a center of the probe, and the pinhole is spaced apart from the center of the probe.

14. The plasma processing system as claimed in claim 8, wherein
the plasma processing apparatus further includes a chamber for isolating a region where the plasma is generated from the outside, and
the plasma density measuring device is positioned outside the chamber and configured to be coupled to a view port of the chamber.

15. A plasma processing system, comprising:
a plasma processing apparatus configured to generate plasma; and
a plasma density measuring device including:
a first sensor configured to measure a microwave spectrum of an input port reflection parameter of the plasma, the first sensor including a probe having a flat plate shape on which a pinhole is formed, and
a second sensor including an optical sensor configured to measure an optical signal generated from the plasma, the optical sensor being configured to measures the optical signal through the pinhole of the probe of the first sensor.

16. The plasma processing system as claimed in claim 15, further comprising a network analyzer electrically connected to the first sensor, the network analyzer being configured to transmit a signal in a microwave band to the first sensor and to read the microwave spectrum of the input port reflection parameter measured by the first sensor.

17. The plasma processing system as claimed in claim 16, wherein the plasma density measuring device further includes a signal line connecting the probe to the network analyzer and spaced apart from the pinhole.

18. The plasma processing system as claimed in claim 16, further comprising a processor configured to calculate an absolute value of a density of a part of the plasma based on the microwave spectrum of the input port reflection parameter and to calculate a radial profile of a relative value of the density of the plasma based on the optical signal measured by the second sensor.

19. The plasma processing system as claimed in claim 18, wherein the processor is further configured to determine a radial profile of an absolute value of the density of the plasma, based on the absolute value of the density of the part of the plasma and the radial profile of the relative value of the density of the plasma.

* * * * *